United States Patent
Meyer et al.

(10) Patent No.: US 11,710,650 B2
(45) Date of Patent: Jul. 25, 2023

(54) METHOD FOR SORTING OPTOELECTRONIC SEMICONDUCTOR COMPONENTS AND DEVICE FOR SORTING OPTOELECTRONIC SEMICONDUCTOR COMPONENTS

(71) Applicant: OSRAM Opto Semiconductors GmbH, Regensburg (DE)

(72) Inventors: Tobias Meyer, Kelheim (DE); Korbinian Perzlmaier, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 127 days.

(21) Appl. No.: 17/440,841

(22) PCT Filed: Feb. 25, 2020

(86) PCT No.: PCT/EP2020/054893
§ 371 (c)(1),
(2) Date: Sep. 20, 2021

(87) PCT Pub. No.: WO2020/187533
PCT Pub. Date: Sep. 24, 2020

(65) Prior Publication Data
US 2022/0148897 A1    May 12, 2022

(30) Foreign Application Priority Data
Mar. 20, 2019    (DE) .................. 10 2019 107 143.7

(51) Int. Cl.
*H01L 21/67*    (2006.01)
*H01L 31/18*    (2006.01)
*H01L 33/00*    (2010.01)

(52) U.S. Cl.
CPC ...... *H01L 21/67271* (2013.01); *H01L 31/186* (2013.01); *H01L 33/0095* (2013.01)

(58) Field of Classification Search
None
See application file for complete search history.

(56) References Cited

U.S. PATENT DOCUMENTS

| | | | |
|---|---|---|---|
| 8,083,066 B2 * | 12/2011 | Bourely | B07C 5/34 209/939 |
| 2011/0236264 A1 * | 9/2011 | Rajagopal | B01L 3/502761 209/132 |

(Continued)

FOREIGN PATENT DOCUMENTS

| | | |
|---|---|---|
| DE | 10 2013 102 322 A1 | 9/2014 |
| DE | 10 2015 101 671 A1 | 8/2016 |
| DE | 10 2016 111 059 A1 | 12/2017 |

OTHER PUBLICATIONS

International Search Report issued for corresponding International Patent Application No. PCT/EP2020/054893 dated Jun. 23, 2020, along with an English translation.

(Continued)

*Primary Examiner* — Bradley Smith
(74) *Attorney, Agent, or Firm* — Hauptman Ham, LLP (57) ABSTRACT

A method for sorting optoelectronic semiconductor components is specified. The semiconductor components each include an active region for emission or detection of electromagnetic radiation. The method includes the following steps: introducing the semiconductor components into a sorting region on a specified path; irradiating the optoelectronic semiconductor components with electromagnetic radiation of a first wavelength range to generate dipole moments by charge separation in the active regions of the optoelectronic semiconductor components; and deflecting the optoelectronic semiconductor components from the (Continued)

specified path as a function of their dipole moment by means of a non-homogeneous electromagnetic field. A device for sorting optoelectronic semiconductor components is further specified.

18 Claims, 4 Drawing Sheets

(56) References Cited

U.S. PATENT DOCUMENTS

2018/0269234 A1     9/2018   Hughes et al.
2019/0004105 A1     1/2019   Henley
2022/0319882 A1*   10/2022   Meyer ................. H01L 25/0753

OTHER PUBLICATIONS

Written Opinion issued for corresponding International Patent Application No. PCT/EP2020/054893 dated Jun. 23, 2020.
"Flow cytometry", Wikipedia <https://en.wikipedia.org/wiki/Flow_cytometry> (retrievd Sep. 16, 2021).

* cited by examiner

METHOD FOR SORTING OPTOELECTRONIC SEMICONDUCTOR COMPONENTS AND DEVICE FOR SORTING OPTOELECTRONIC SEMICONDUCTOR COMPONENTS

CROSS REFERENCE TO RELATED APPLICATION

This application is a National Stage of International Application No. PCT/EP2020/054893, filed on Feb. 25, 2020, which designates the United States and was published in Europe, and which claims priority to German Patent Application No. 10 2019 107 143.7, filed on Mar. 20, 2019, in the German Patent Office. Both of the aforementioned applications are hereby incorporated by reference in their entireties.

A method for sorting optoelectronic semiconductor components and a device for sorting optoelectronic semiconductor components are specified. An optoelectronic semiconductor component is configured in particular for generating and/or detecting electromagnetic radiation, in particular light perceptible to the human eye.

A task to be solved is to specify a method for sorting optoelectronic semiconductor components that enables efficient sorting of semiconductor components.

Another task to be solved is to specify a device for sorting optoelectronic semiconductor components that enables efficient sorting of semiconductor components.

According to at least one embodiment of the method for sorting optoelectronic semiconductor components, the semiconductor components each comprise an active region for emission or detection of electromagnetic radiation. The active region preferably comprises a pn junction, a double heterostructure, a single quantum well (SQW) structure or a multiple quantum well (MQW) structure for radiation generation or detection. The semiconductor components may be light emitting diodes or photodiodes.

According to at least one embodiment of the method for sorting optoelectronic semiconductor components, the semiconductor components are introduced into a sorting region on a specified path. The sorting region is, for example, the region in which sorting of the semiconductor components takes place according to one or more of their properties. The introduction of semiconductor components into the sorting region is performed on a specified path. For example, the introduction is performed by means of compressed air, with the help of gravity or a liquid jet.

According to at least one embodiment of the method for sorting optoelectronic semiconductor components, the optoelectronic semiconductor components are irradiated with electromagnetic radiation of a first wavelength range to generate dipole moments by charge separation in the active regions of the optoelectronic semiconductor components. Incidence of electromagnetic radiation of the first wavelength range into the active region of an optoelectronic semiconductor component can generate an electron-hole pair in the active region, causing a dipole moment in the semiconductor component. For a light emitting diode or photodiode, the first wavelength range may be in the region of the emission or detection wavelength of that light emitting diode or photodiode. Going further, the first wavelength may also be smaller than the emission or detection wavelength and, for example, may be 10 nm to 200 nm smaller than emission or detection wavelength, respectively. The generated dipole moment is expediently small enough to avoid damage to the semiconductor components by electrostatic discharges.

According to at least one embodiment of the method for sorting optoelectronic semiconductor components, the optoelectronic semiconductor components are deflected from the specified path as a function of their dipole moment by means of a non-homogeneous electromagnetic field. A non-homogeneous electromagnetic field causes a deflecting force on a dipole moving through the field. For example, optoelectronic semiconductor components in which a large dipole moment has been formed experience greater deflection than optoelectronic semiconductor components that comprise a smaller or no dipole moment.

According to at least one embodiment of the method for sorting optoelectronic semiconductor components, each comprising an active region for emission or detection of electromagnetic radiation, the method comprises the following steps:
- introducing the semiconductor components into a sorting region on a specified path,
- irradiating the optoelectronic semiconductor components with electromagnetic radiation of a first wavelength range to generate dipole moments by charge separation in the active regions of the optoelectronic semiconductor components, and
- deflecting the optoelectronic semiconductor components from the specified path as a function of their dipole moment by means of a non-homogeneous electromagnetic field.

A method for sorting optoelectronic semiconductor components described herein is based, inter alia, on the following considerations: for sorting optoelectronic semiconductor components, a so-called pick-and-place method is conventionally used, in which the semiconductor components are removed from a wafer or a carrier film and placed again. For example, all devices that do not comprise a certain sorting parameter can be removed from the wafer or foil in this way. However, with increasing numbers of semiconductor components, the number of required pick-and-place operations also increases, resulting in increased sorting times. Furthermore, a pick-and-place method can be impaired by a small edge length of the semiconductor components, as this makes it difficult to grip individual semiconductor components securely.

The method for sorting optoelectronic semiconductor components described here makes use, inter alia, of the idea of implementing a sorting of optoelectronic semiconductor components as a function of a dipole moment generated in these semiconductor components. The semiconductor components are introduced into a sorting region along a specified path. In the sorting region, the optoelectronic semiconductor components are irradiated with electromagnetic radiation of a first wavelength range, allowing a dipole moment to be formed in the semiconductor components. The magnitude of this dipole moment depends inter alia on whether a semiconductor component comprises a short circuit or an electrical shunt. Going further, the dipole moment generated depends on the emission or detection wavelength for which the semiconductor component is intended, with respect to the first wavelength range. The semiconductor components then experience deflection from the specified path by means of a non-homogeneous electromagnetic field as a function of the magnitude of their dipole moment. Thus, a sorting process can sort a large number of optoelectronic semiconductor components according to the magnitude of their dipole moment. Picking up and placing components one by one can be advantageously avoided. A further advantage is that semiconductor components with an edge length of at most 100 µm, preferably of at most 10 µm and particularly preferably of at most 1 µm can also be sorted in this way.

According to at least one embodiment of the method for sorting optoelectronic semiconductor components, different groups of optoelectronic semiconductor components are configured for emission or detection of electromagnetic radiation within different wavelength ranges. The different wavelength ranges differ in their peak or dominant wavelengths. The different wavelength ranges may overlap. Different wavelength ranges may comprise different spectral bandwidths.

According to at least one embodiment of the method for sorting optoelectronic semiconductor components, the electromagnetic radiation of the first wavelength range comprises such a wide bandwidth that all groups of optoelectronic semiconductor components are excited. Preferably, the first wavelength range includes in its spectral bandwidth the peak or dominant wavelengths of all groups of optoelectronic semiconductor components. Thus, all optoelectronic semiconductor components can be excited simultaneously. Advantageously, semiconductor components of different emission or detection wavelengths can thus be sorted according to the presence of a short circuit or an electrical shunt. Optoelectronic semiconductor components that do not comprise a short circuit or electrical shunt, for example, form a dipole moment and thus experience a deflection from the specified path. Optoelectronic semiconductor components that, on the other hand, comprise a short circuit or electrical shunt, for example, form no dipole moment or only a reduced dipole moment and thus experience little or no deflection from the specified path.

According to at least one embodiment of the method for sorting optoelectronic semiconductor components, the electromagnetic radiation of the first wavelength range comprises such a small bandwidth that only one of the groups of different optoelectronic semiconductor components is selectively excited at a time. For example, the first wavelength range may comprise a monochromatic electromagnetic radiation whose wavelength is identical with the peak or dominant wavelength of one of the groups, or the first wavelength range may have a certain wavelength distance from the peak or dominant wavelength, which may, for example, allow for any Stokes shift that may be present. For example, a group configured to emit red light can be separated from a group configured to emit blue light. A dipole moment is thereby induced only in the semiconductor components whose emission or detection wavelength is within the first wavelength range. For example, if the first wavelength range includes only electromagnetic radiation in a red wavelength range, only an optoelectronic semiconductor component intended for emission or detection of electromagnetic radiation located in the red wavelength range will be deflected from its specified path. However, a component intended for the emission or detection of an electromagnetic radiation in the blue wavelength range experiences only a slight or no deflection from its specified path. Advantageously, a sorting according to the emission or detection wavelengths of different semiconductor components can be performed.

According to at least one embodiment of the method for sorting optoelectronic semiconductor components, the specified path is a fall axis along which the semiconductor components move in essentially free fall after being introduced into the sorting region (neglecting air friction). By means of the non-homogeneous electromagnetic field, the semiconductor components are deflected as a function of the generated dipole moment transverse to the fall axis.

According to at least one embodiment of the method for sorting optoelectronic semiconductor components, the intensity of the electromagnetic radiation of the first wavelength range is modulated in time and/or the intensity and/or polarization of the non-homogeneous electromagnetic field is modulated in time. The time modulated intensity of the electromagnetic radiation of the first wavelength range can induce a time varying current flow in the optoelectronic semiconductor components. The induced current flow in the semiconductor component is advantageously small enough to avoid damage to the semiconductor components.

A semiconductor component in which a time-varying current flow is generated may experience a deflecting force in an electromagnetic field, which may result in a deflection from its specified path.

The caused current flow in a semiconductor component with a short circuit or an electrical shunt may be different from the caused current flow in an intact semiconductor component. As a result, the magnitude of the deflecting force may be different.

According to at least one embodiment of the method for sorting optoelectronic semiconductor components, the intensity and/or the polarization of the non-homogeneous electromagnetic field are modulated synchronously with the intensity of the electromagnetic radiation of the first wavelength range. The synchronous modulation of the non-homogeneous electromagnetic field and the electromagnetic radiation of the first wavelength range may, but need not, be in phase. By this synchronization it can be achieved that a deflection takes place in the same direction independent of the direction of the current flow and thus the deflection is resonantly amplified as well. This is particularly advantageous in the case of an oscillating current flow, in which deflections in opposite directions could otherwise compensate each other.

According to at least one embodiment of the method for sorting optoelectronic semiconductor components, the semiconductor components pass through a homogeneous auxiliary electromagnetic field before the non-homogeneous electromagnetic field. The homogeneous auxiliary electromagnetic field can exert a torque on an optoelectronic semiconductor component comprising a dipole moment. The torque varies depending on the orientation of the optoelectronic semiconductor component, thereby causing the optoelectronic semiconductor component to be aligned. The orientation of the semiconductor component may be parallel to the field lines of the auxiliary field. Preferably, the field lines of the auxiliary field are aligned transversely, in particular orthogonally, to the specified path. Uniform alignment of the optoelectronic semiconductor components prior to traversing the non-homogeneous field can, for example, facilitate uniform deflection when traversing the non-homogeneous electromagnetic field. In particular, two or more auxiliary fields may be used to align the semiconductor components. For example, two auxiliary fields are arranged for this purpose transversely, preferably orthogonally to each other in a plane transverse, in particular orthogonal to the specified path.

According to at least one embodiment of the method for sorting optoelectronic semiconductor components, the semiconductor components are at least partially singulated before being introduced into the sorting region. Separation of semiconductor components advantageously facilitates sorting, since each individual optoelectronic semiconductor component can thus be deflected from the specified path according to the magnitude of its dipole moment. At least partially singulated means that the semiconductor components are individual, but do not necessarily have to enter the sorting region strictly one after the other. For example, an individual detachment of semiconductor components from a carrier or an individual discharge from a reservoir occurs.

Furthermore, a device for sorting optoelectronic semiconductor components is specified. With the device, in particular, a method for sorting optoelectronic semiconductor components described herein can be carried out. That is, all features disclosed for the method for sorting optoelectronic semiconductor components are also disclosed for the device for sorting optoelectronic semiconductor components, and vice versa.

According to at least one embodiment of the device for sorting optoelectronic semiconductor components, the optoelectronic semiconductor components each comprise an active region for emission or detection of electromagnetic radiation. The semiconductor components are configured for emission of a radiation in an emission wavelength range and/or for detection of an electromagnetic radiation in a detection wavelength range.

According to at least one embodiment of the device for sorting optoelectronic semiconductor components, the device comprises a sorting region. Within the sorting region, the optoelectronic semiconductor components can be sorted according to a desired characteristic.

According to at least one embodiment of the device for sorting optoelectronic semiconductor components, the device comprises a light source for generating electromagnetic radiation of a first wavelength range. For example, the light source may comprise one or more semiconductor light emitting diodes or semiconductor laser diodes. The light source may be configured to emit coherent and/or incoherent electromagnetic radiation. In particular, the light source is a spectrally tunable light source whose peak or dominant wavelength and/or whose spectral bandwidth is variable.

According to at least one embodiment of the device for sorting optoelectronic semiconductor components, the device comprises a first source of a non-homogeneous electromagnetic field. A non-homogeneous electromagnetic field exerts a force on a body comprising a dipole moment. The body can be deflected from a specified path as a result.

According to at least one embodiment of the device for sorting optoelectronic semiconductor components, the semiconductor components move along a specified path in the sorting region. For example, the semiconductor components are moved along the specified path using an air flow.

According to at least one embodiment of the device for sorting optoelectronic semiconductor components, the light source emits electromagnetic radiation of a first wavelength range suitable for exciting the optoelectronic semiconductor components to generate a dipole moment in the semiconductor components. The wavelength of the electromagnetic radiation of the first wavelength range can advantageously be in the emission or detection wavelength range of the optoelectronic semiconductor components or 10 nm to 200 nm below it. Thus, an efficient excitation of the semiconductor components is possible. By an excitation is meant, in particular, the generation of an electron-hole pair and consequently the generation of a dipole moment in a semiconductor component.

According to at least one embodiment of the device for sorting optoelectronic semiconductor components, the optoelectronic semiconductor components are deflected from the specified path by means of the non-homogeneous electromagnetic field as a function of their dipole moment. According to the deflection, the semiconductor components can thus be sorted depending on their dipole moment. For example, a lower or no dipole moment is formed in semiconductor components that comprise a short circuit or electrical shunt.

According to at least one embodiment of the device for sorting optoelectronic semiconductor components, the sorting region comprises a reservoir that receives a plurality of semiconductor components and discharges them at least partially singulated in the specified path. The reservoir may include, for example, a hopper that allows optoelectronic semiconductor components to be dispensed individually. The singulation may be performed, for example, by means of a vibrating motion or by embedding individual semiconductor components in droplets of a liquid.

According to at least one embodiment of the device for sorting optoelectronic semiconductor components, the specified path is a fall axis along which the semiconductor components move freely at least some of the time. With other words, the semiconductor components are in a substantially free fall along a fall axis and can be deflected from their fall axis.

According to at least one embodiment of the device for sorting optoelectronic semiconductor components, the movement of the optoelectronic semiconductor components along the specified path takes place in a chamber with reduced air or gas pressure or in a chamber filled with a liquid. A reduced air or gas pressure may be, in particular, a partial vacuum. For example, reduced air or gas pressure reduces or avoids undesirable deflection of free-falling optoelectronic semiconductor components along their fall axis due to turbulent air currents or other undesirable aerodynamic effects. A viscous fluid can increase the frictional resistance of semiconductor components in a falling motion, thereby decreasing their falling velocity. A reduced falling velocity can advantageously result in a longer dwell time in the non-homogeneous electromagnetic field, contributing to a greater deflection from the fall axis. The liquid used in this process is expediently transmissive to the electromagnetic radiation of the first wavelength range.

According to at least one embodiment of the device for sorting optoelectronic semiconductor components, different groups of optoelectronic semiconductor components are configured for emission and/or detection of electromagnetic radiation within different wavelength ranges and the light source may comprise such a broadband spectral emission characteristic that all groups of optoelectronic semiconductor components are excited. By exciting optoelectronic semiconductor components of all groups, a sorting according to functioning semiconductor components and defective semiconductor components, for example due to a short circuit or an electrical shunt, can advantageously be easily performed.

According to at least one embodiment of the device for sorting optoelectronic semiconductor components, different groups of optoelectronic semiconductor components are configured for emission and/or detection of electromagnetic radiation of different wavelengths, wherein the light source comprises such a narrow spectral emission characteristic that only one of the groups of different optoelectronic semiconductor components is selectively excited at a time. For example, the light source comprises a monochromatic radiation whose wavelength corresponds to the peak or dominant wavelength of the emission or detection wavelength range of optoelectronic semiconductor components of one of the groups. Advantageously, this makes it easy to sort according to the emission or detection wavelength range of a selected group.

According to at least one embodiment of the device for sorting optoelectronic semiconductor components, the first source is arranged along the specified path downstream of a second source of an electromagnetic field configured to generate a homogeneous auxiliary electromagnetic field. The field lines of the auxiliary field advantageously extend transversely, in particular orthogonally, to the specified path of the semiconductor components. The homogeneous auxiliary field can cause a torque on a dipole and thus an alignment of the dipole along the field lines of the homogeneous auxiliary field. A uniform alignment of the optoelectronic semiconductor components may advantageously cause a simplified deflection of the optoelectronic semiconductor components in only one direction.

According to at least one embodiment of the device for sorting optoelectronic semiconductor components, the first and/or second electromagnetic field is an electric field.

According to at least one embodiment of the device for sorting optoelectronic semiconductor components, the first and/or second electromagnetic field is a magnetic field. A magnetic field may be generated by means of a current-carrying conductor, such as a coil, or a permanent magnet.

Further advantages and advantageous embodiments and further embodiments of the method for sorting optoelectronic semiconductor components result from the following embodiments shown in connection with the figures.

Showing in.

Elements that are identical, similar or have the same effect are marked with the same reference signs in the figures. The figures and the proportions of the elements shown in the figures with respect to each other are not to be regarded as to scale. Rather, individual elements may be shown exaggeratedly large for better representability and/or for better comprehensibility.

Figure 1A:
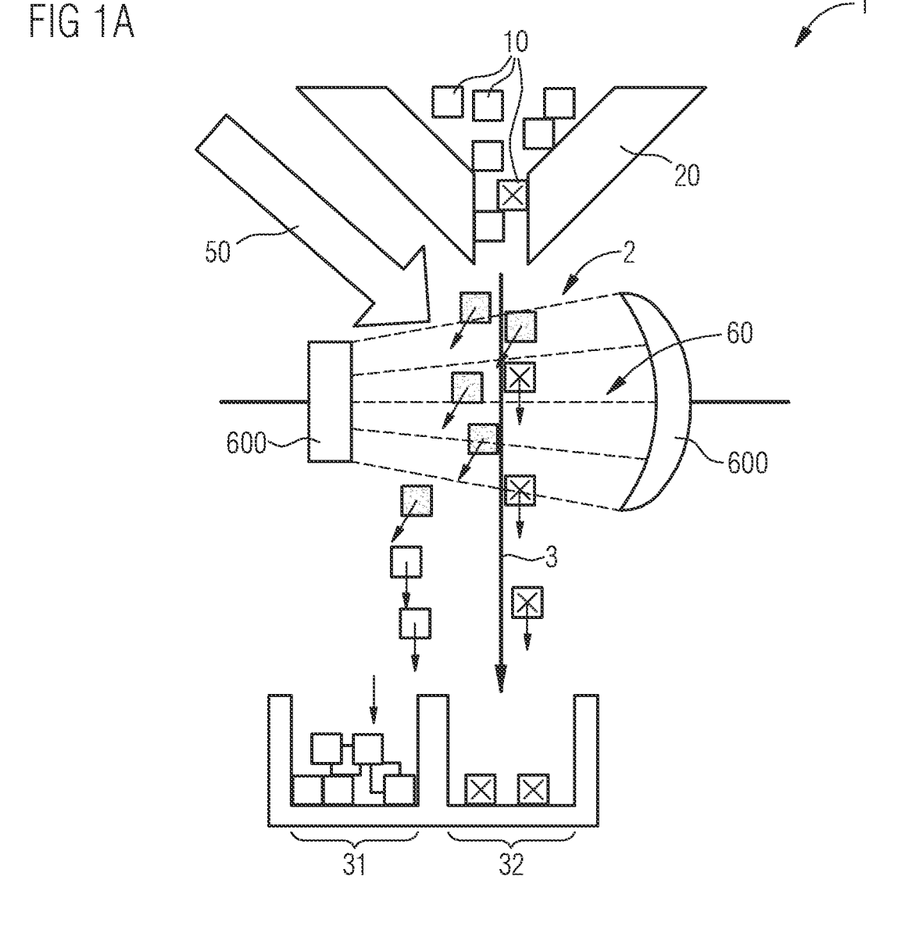
FIG. 1A a schematic representation of a device for sorting optoelectronic semiconductor components described herein according to a first exemplary embodiment, FIG. 1B a schematic representation of a first and second collecting tray of a device for sorting optoelectronic semiconductor components according to the first exemplary embodiment described herein in a top view, FIG. 2 a schematic representation of a semiconductor component described herein according to a first exemplary embodiment, FIG. 3 a schematic representation of a semiconductor component described herein according to a second exemplary embodiment, FIG. 4 a schematic representation of a device for sorting optoelectronic semiconductor components described herein according to a second exemplary embodiment, FIG. 5 the time-dependent course of the intensity of an electromagnetic radiation and an electromagnetic field according to a first exemplary embodiment, and FIG. 6 the time-dependent course of the intensity of an electromagnetic radiation and an electromagnetic field according to a second exemplary embodiment.

FIG. 1A shows a schematic representation of a device for sorting optoelectronic semiconductor components 1 described herein according to a first exemplary embodiment. The device for sorting optoelectronic semiconductor components 1 comprises a funnel-shaped reservoir 20 in which a plurality of optoelectronic semiconductor components 10 are located. The optoelectronic semiconductor components 10 marked with an X comprise, for example, an internal short circuit or an electrical shunt and are thus defective. The remaining semiconductor components 10 are intact. The reservoir 20 has an opening on its underside through which the optoelectronic semiconductor components 10 can be dispensed singulated along a specified path 3. The optoelectronic semiconductor components 10 move along a specified path 3 due to the force of gravity acting on them. The specified path 3 is oriented vertically and thus corresponds to a fall axis. The orientation of the field lines of the non-homogeneous electromagnetic field 60 is advantageously transverse to the specified path 3.

Along the specified path 3, the optoelectronic semiconductor components 10 enter the sorting region 2. In the sorting region 2, the semiconductor components 10 are sorted according to a predetermined property, such as the presence of a short circuit or an electrical shunt in a semiconductor component 10 or the intended emission or detection wavelength of a semiconductor component 10. The sorting is performed by means of a selective deflection of the semiconductor components 10. In order to cause a selective deflection of the optoelectronic semiconductor components 10, they are first excited by means of an electromagnetic radiation 50 of a first wavelength range. Due to the excitation, electron-hole pairs may be generated in the active regions 100 of the semiconductor components 10, causing a dipole moment within a semiconductor component 10. A defective semiconductor component 10 that comprises a short circuit or an electrical shunt across its pn junction may form little or no dipole moment.

Selective deflection of the optoelectronic semiconductor components 10 from the specified path 3 as a function of their dipole moment is then performed by means of a non-homogeneous electromagnetic field 60 provided by a first source 600. The defective optoelectronic semiconductor components 10, which are marked with an X and comprise no dipole moment or only a small dipole moment, are deflected little or not at all from the specified path 3 and thus fall into the second collecting tray 32 provided for this purpose. The intact optoelectronic semiconductor components 10 that have been deflected from the specified path 3 due to their dipole moment by the non-homogeneous electromagnetic field 60 fall into the first collecting tray 31 provided for this purpose. A separation of defective semiconductor components 10 from intact semiconductor components 10 thus occurs.

For example, the first and second collecting trays 31, 32 can be at least partially filled with a liquid to dampen the impact of the optoelectronic semiconductor components 10.

Figure 1B:
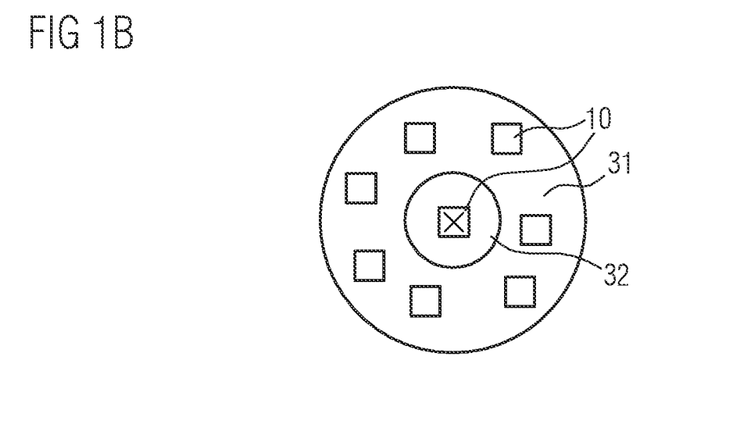

FIG. 1B shows a schematic representation of a first and second collecting trays 31, 32 of a device for sorting optoelectronic semiconductor components 1 described herein according to the first exemplary embodiment in a top view. The collecting trays 31, 32 shown here comprise a concentric shape. The second collecting tray 32 is concentrically located within the first collecting tray 31. A plurality of optoelectronic semiconductor components 10 are located in the collecting trays 31, 32. The center of the second collecting tray 32 is advantageously located at the lower end point of the specified path 3.

Those optoelectronic semiconductor components 10 which experience no deflection or only a slight deflection due to the non-homogeneous electromagnetic field 60 are thus located within the second collecting tray 32. Those optoelectronic semiconductor components 10 which comprise a large dipole moment are located in the first collecting tray 31 provided for this purpose. The concentric assembly of the two collecting trays 31, 32 advantageously allows the collection of optoelectronic semiconductor components 10 independent of their different deflection direction caused by their different orientation.

Figure 2:
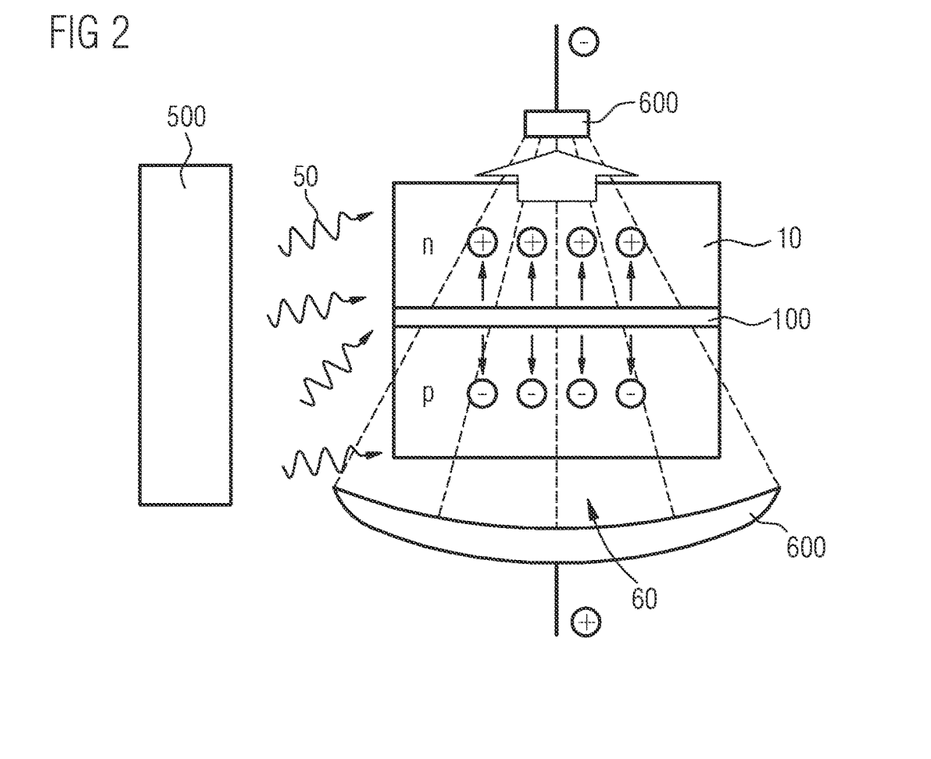

FIG. 2 shows a schematic representation of a semiconductor component 10 described herein according to a first exemplary embodiment. The optoelectronic semiconductor component 10 comprises an active region 100 which comprises a pn junction. By means of an excitation by an electromagnetic radiation of a first wavelength range 50 emitted from a light source 500, the optoelectronic semiconductor component 10 can form electron-hole pairs in the active zone 100. The electron-hole pairs generate a dipole moment in the optoelectronic semiconductor component 10. Since the optoelectronic semiconductor component 10 is located within a first source 600 of non-homogeneous electromagnetic field 60, a force now acts on the optoelectronic semiconductor component 10 due to the dipole moment. The force acting on the optoelectronic semiconductor component 10 is indicated by an arrow with the letter F.

Figure 3:
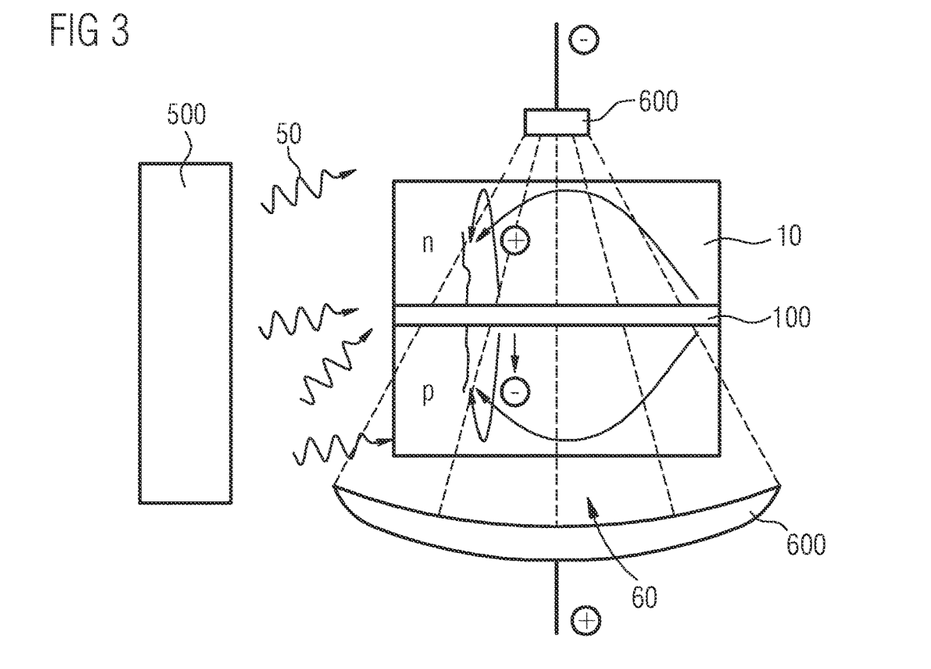

FIG. 3 shows a schematic representation of an optoelectronic semiconductor component 10 described herein according to a second exemplary embodiment. The second exemplary embodiment is substantially the same as the first exemplary embodiment, but deviates therefrom to show a defective optoelectronic semiconductor component 10 that comprises a short circuit or an electrical shunt. The active zone 100 can perform charge separation, but due to its short circuit or electrical shunt, the dipole moment is immediately removed. Thus, a small or no dipole moment is formed in the optoelectronic semiconductor component 10. The optoelectronic semiconductor component 10 shown here thus experiences no force or only a small force, although it is located in a non-homogeneous electromagnetic field 60. In a movement along a specified path 3, no deflection by the non-homogeneous electromagnetic field 60 would result for this optoelectronic semiconductor component 10.

Figure 4:
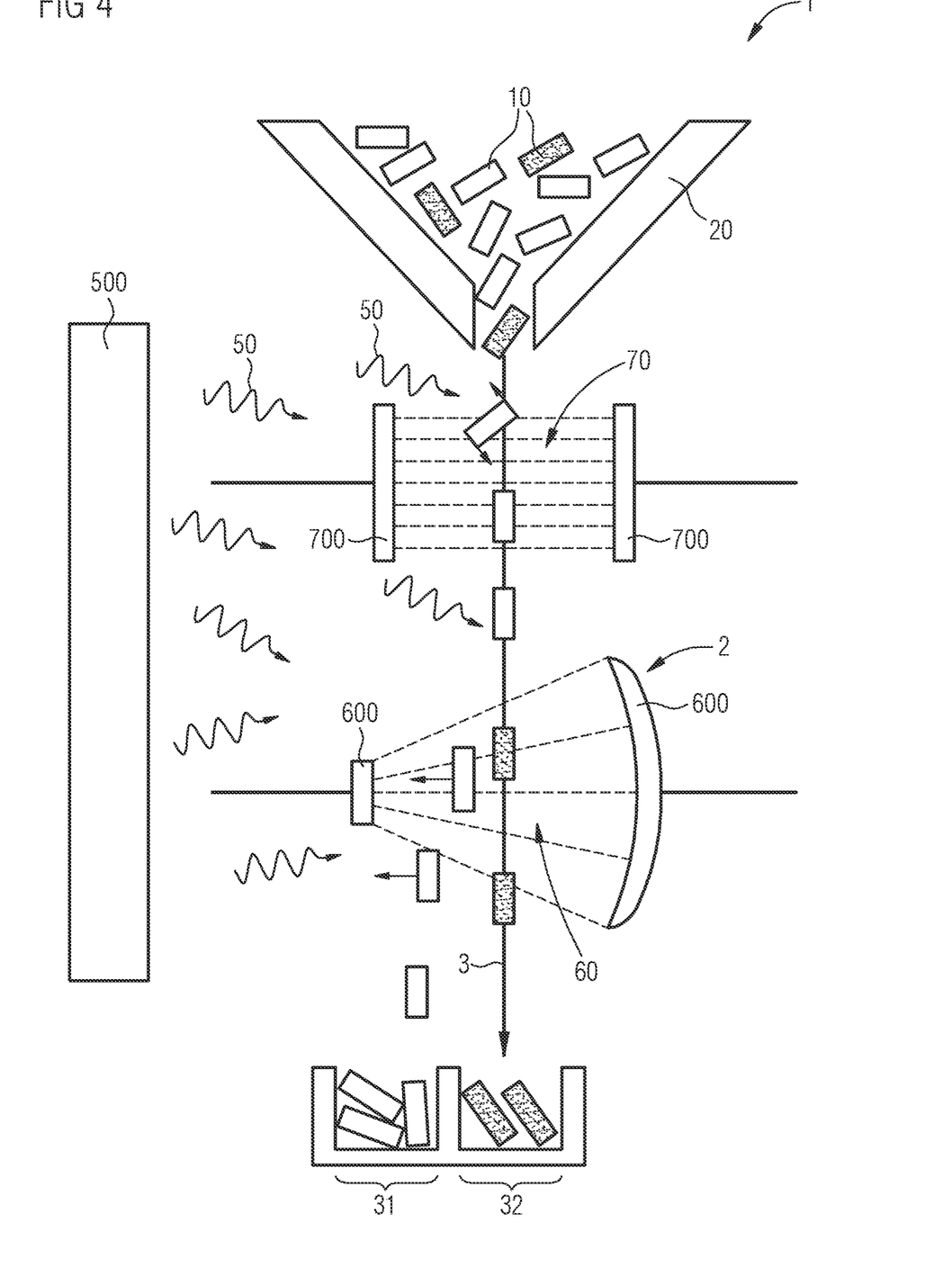

FIG. 4 shows a schematic representation of a device for sorting optoelectronic semiconductor components 1 described herein according to a second exemplary embodiment. A plurality of different optoelectronic semiconductor components 10 are located in a reservoir 20, which separates the optoelectronic semiconductor components 10 via an opening, discharging them in a specified path 3. The optoelectronic semiconductor components 10 are excited by means of a light source 500 along the specified path 3 with electromagnetic radiation 50 of a first wavelength range. A dipole moment is formed in the excited semiconductor components 10.

The singulated optoelectronic semiconductor components 10 initially enter a homogeneous auxiliary electromagnetic field 70 generated by a second source 700. The homogeneous auxiliary field 70 generates a torque on the semiconductor components 10 depending on their dipole moment and their orientation with respect to the field lines of the auxiliary field 70, resulting in an alignment of the semiconductor components 10.

The aligned optoelectronic semiconductor components 10 move further along the specified path 3 into the sorting region 2. The sorting region 2 comprises a first source 600 of non-homogeneous electromagnetic field 60. The non-homogeneous electromagnetic field 60 causes a force transverse to the specified path 3 as a function of the dipole moment of the optoelectronic semiconductor component 10.

Defective, for example short-circuited, semiconductor components 10 that comprise no or only a small dipole moment thus experience only a small or no deflection from the specified path 3. Without a deflecting force, the defective semiconductor components 10 follow the specified path 3 to the second collecting tray 32. The optoelectronic semiconductor components 10 that experience a deflection due to their dipole moment leave the specified path 3 and move to the first collecting tray 31 provided for this purpose.

To realize a multi-stage sorting system, several devices for sorting optoelectronic semiconductor components 10 can also be arranged one behind the other in a staggered manner, or there can be several excitations with electromagnetic radiation 50 of different wavelength ranges and several sorting regions 2 arranged one behind the other. For example, defective semiconductor components 10 could be sorted out in a first sorting step within a device for sorting optoelectronic semiconductor components 1 and then the intact semiconductor components 10 could be sorted according to their emission or detection wavelength.

Figure 5:
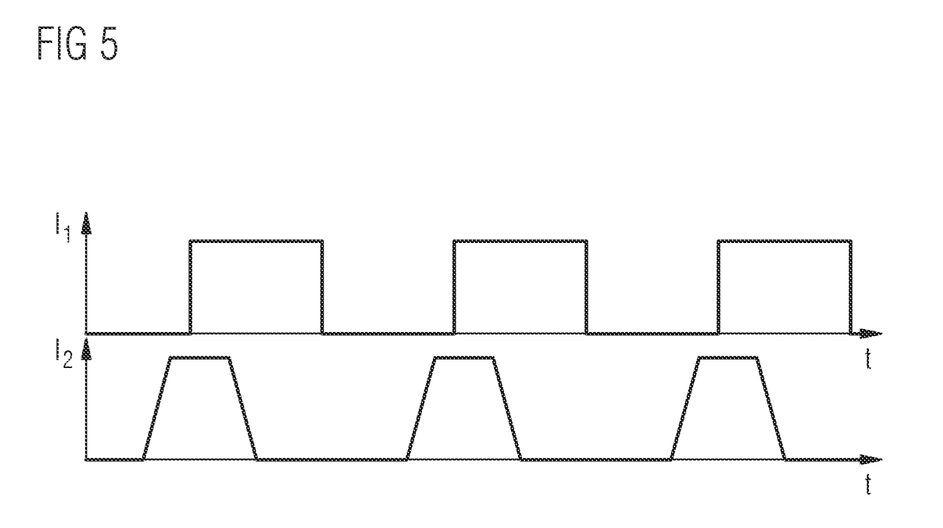

FIG. 5 shows the time-dependent course of the intensity of an electromagnetic radiation $I_1$ and an electromagnetic field $I_2$ according to a first exemplary embodiment. On the y-axis labeled $I_1$, the intensity of the electromagnetic radiation is plotted as a function of time t. On the y-axis labeled $I_2$, the intensity of the electromagnetic field is plotted as a function of time t. The modulation of the intensity of the electromagnetic radiation $I_1$ is synchronous with the modulation of the intensity of the electromagnetic field $I_2$, wherein the intensity of the electromagnetic radiation $I_1$ comprises a phase shift with respect to the intensity of the electromagnetic field $I_2$. The electromagnetic radiation can trigger a current flow in an irradiated optoelectronic semiconductor component 1. Consequently, the electromagnetic field may exert a force on the semiconductor component 1. In order to achieve deflection in a single direction, it is advantageous if the electromagnetic field is only present during the switch-on process of the electromagnetic radiation.

Figure 6:
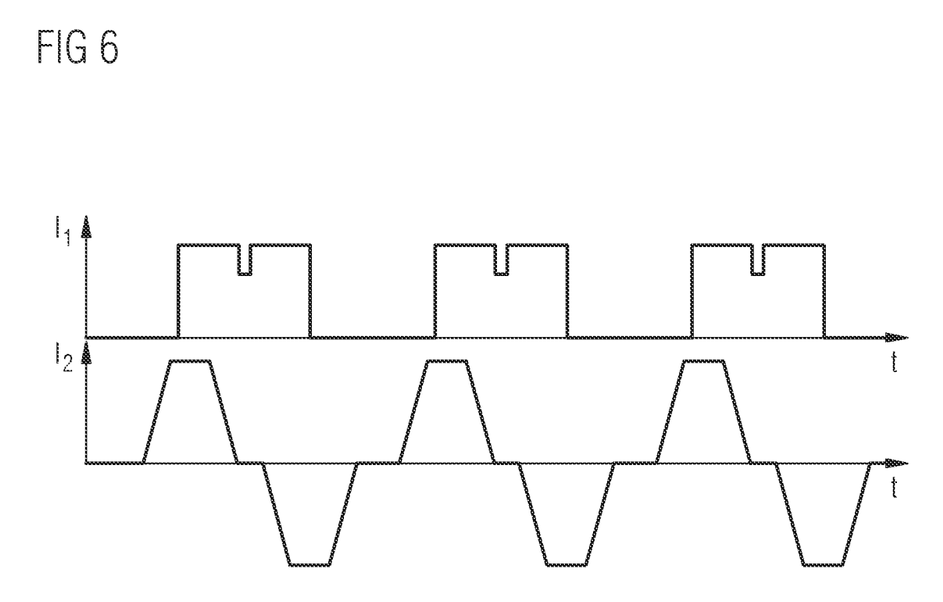

FIG. 6 shows the time-dependent course of the intensity of an electromagnetic radiation and an electromagnetic field according to a second exemplary embodiment. The axis labeling of the diagrams shown in FIG. 6 corresponds to the axis labeling shown in FIG. 5. In the second exemplary embodiment shown here, the polarization of the electromagnetic field $I_2$ is reversed. The polarization of the electromagnetic field $I_2$ changes in each case between the switching-on process and the switching-off process of the electromagnetic radiation $I_1$. Since the direction of an induced current in an irradiated optoelectronic semiconductor component 1 during a turn-on operation of the electromagnetic radiation differs from the direction during a turn-off operation of the electromagnetic radiation, the deflecting force changes direction when the polarization of the electromagnetic field $I_2$ is constant. However, by reversing the polarization of the electromagnetic field $I_2$, deflection of the optoelectronic semiconductor component 1 in a single direction can be advantageously achieved.

The invention is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

LIST OF REFERENCE SIGNS 1 device for sorting optoelectronic semiconductor components
2 sorting region
3 specified path 10 optoelectronic semiconductor component
20 reservoir
31 first collecting tray
32 second collecting tray
50 electromagnetic radiation of a first wavelength range
60 non-homogeneous electromagnetic field
70 homogeneous auxiliary electromagnetic field
100 active region
500 light source
600 first source
700 second source
I1 intensity of an electromagnetic radiation
I2 intensity of an electromagnetic field
t time

The invention claimed is:

1. A method for sorting optoelectronic semiconductor components each comprising an active region for emission or detection of electromagnetic radiation, comprising the following steps:
   introducing the semiconductor components into a sorting region on a specified path,
   irradiating the optoelectronic semiconductor components with electromagnetic radiation of a first wavelength range to generate dipole moments by charge separation in the active regions of the optoelectronic semiconductor components, and
   deflecting the optoelectronic semiconductor components from the specified path as a function of their dipole moment by means of a non-homogeneous electromagnetic field.

2. The method for sorting optoelectronic semiconductor components according to claim 1, wherein different groups of optoelectronic semiconductor components are configured for emission or detection of electromagnetic radiation within different wavelength ranges.

3. The method for sorting optoelectronic semiconductor components according to claim 2, wherein the electromagnetic radiation of the first wavelength range comprises such a wide bandwidth that all groups of optoelectronic semiconductor components are excited.

4. The method for sorting optoelectronic semiconductor components according to claim 2, wherein the electromagnetic radiation of the first wavelength range comprises such a small bandwidth that only one of the groups of different optoelectronic semiconductor components is selectively excited at a time.

5. The method for sorting optoelectronic semiconductor components according to claim 1, wherein the specified path is a fall axis along which the semiconductor components move after being introduced into the sorting region.

6. The method for sorting optoelectronic semiconductor components according to claim 1, wherein the intensity of the electromagnetic radiation of the first wavelength range is modulated in time and/or the intensity and/or polarization of the non-homogeneous electromagnetic field is modulated in time.

7. The method for sorting optoelectronic semiconductor components according to claim 6, wherein the intensity and/or the polarization of the non-homogeneous electromagnetic field is modulated synchronously with the intensity of the electromagnetic radiation of the first wavelength range.

8. The method for sorting optoelectronic semiconductor components according to claim 1, wherein the semiconductor components pass through a homogeneous auxiliary electromagnetic field before the non-homogeneous electromagnetic field.

9. The method for sorting optoelectronic semiconductor components according to claim 1, wherein the semiconductor components are at least partially singulated before being introduced into the sorting region.

10. A device for sorting optoelectronic semiconductor components, each comprising an active region for emission or detection of electromagnetic radiation, comprising a sorting region with a light source and a first source of non-homogeneous electromagnetic field, wherein
   the semiconductor components move along a specified path in the sorting region,
   said light source emits electromagnetic radiation of a first wavelength range adapted to excite said optoelectronic semiconductor components to generate a dipole moment in said semiconductor components, and
   the optoelectronic semiconductor components are deflected in dependence on their dipole moment from the specified path by means of the non-homogeneous electromagnetic field.

11. The device for sorting optoelectronic semiconductor components according to claim 10, wherein the sorting region comprises a reservoir which receives a plurality of semiconductor components and discharges them at least partially singulated in the specified path.

12. The device for sorting optoelectronic semiconductor components according to claim 10, wherein the specified path is a fall axis, and the semiconductor components move freely along the fall axis at least temporarily.

13. The device for sorting optoelectronic semiconductor components according to claim 12, wherein the movement of the optoelectronic semiconductor components along the specified path takes place in a chamber with reduced air or gas pressure or in a chamber filled with a liquid.

14. The device for sorting optoelectronic semiconductor components according to claim 10, wherein
   different groups of optoelectronic semiconductor components are configured for emission and/or detection of electromagnetic radiation within different wavelength ranges, and
   the light source comprises a broadband spectral emission characteristic such that all groups of optoelectronic semiconductor components can be excited.

15. The device for sorting optoelectronic semiconductor components according to claim 10, wherein
   different groups of optoelectronic semiconductor components are configured to emit electromagnetic radiation within different wavelength ranges, and
   the light source comprises such a narrow spectral emission characteristic that only one of the groups of optoelectronic semiconductor components at a time can be selectively excited.

16. The device for sorting optoelectronic semiconductor components according to claim 10, wherein the first source is arranged downstream along the specified path of a second source of an electromagnetic field which is configured to generate a homogeneous auxiliary electromagnetic field.

17. The device for sorting optoelectronic semiconductor components according to claim 16, wherein the non-homogeneous electromagnetic field and/or the homogeneous auxiliary electromagnetic field is an electric field.

18. The device for sorting optoelectronic semiconductor components according to claim 16, wherein the non-homogeneous electromagnetic field and/or the homogeneous auxiliary electromagnetic field is a magnetic field.

* * * * *